United States Patent [19]
Reddy et al.

[11] Patent Number: 5,883,526
[45] Date of Patent: Mar. 16, 1999

[54] HIERARCHICAL INTERCONNECT FOR PROGRAMMABLE LOGIC DEVICES

[75] Inventors: Srinivas Reddy, Fremont; Manuel Mejia, San Jose, both of Calif.

[73] Assignee: Altera Corporation, San Jose, Calif.

[21] Appl. No.: 840,113

[22] Filed: Apr. 17, 1997

Related U.S. Application Data

[60] Provisional application No. 60/027,874 Oct. 25, 1996.
[51] Int. Cl.$^6$ ................................................. H03K 19/177
[52] U.S. Cl. ................................................ 326/41; 326/39
[58] Field of Search ................................. 326/47, 41, 44, 326/39

[56] References Cited

U.S. PATENT DOCUMENTS

| | | |
|---|---|---|
| Re. 34,363 | 8/1993 | Freeman . |
| 4,609,986 | 9/1986 | Hartmann et al. ....................... 364/200 |
| 4,617,479 | 10/1986 | Hartmann et al. . |
| 4,706,216 | 11/1987 | Carter ........................................ 365/94 |
| 4,871,930 | 10/1989 | Wong et al. . |
| 4,963,768 | 10/1990 | Agrawal et al. . |
| 5,241,224 | 8/1993 | Pedersen et al. . |
| 5,260,610 | 11/1993 | Pedersen et al. . |
| 5,260,611 | 11/1993 | Cliff et al. . |
| 5,268,598 | 12/1993 | Pedersen et al. . |
| 5,436,575 | 7/1995 | Pedersen et al. .......................... 326/40 |
| 5,463,328 | 10/1995 | Cope et al. ............................... 326/41 |

FOREIGN PATENT DOCUMENTS 9610054  5/1996  United Kingdom  .........  H03K 19/177

OTHER PUBLICATIONS

*XC7300 CMOS CPLD Family*, XILINX, Jun. 1, 1996, version 1.0, pp. 3–71 through 3–80.
*FLEX 10K Embedded Programmable Logic Family*, Altera Corporation, Jun. 1996, version 2, pp. 31 through 58.
*MAX 9000 Programmable Logic Device Family*, Altera Corporation, Jun. 1996, version 4, pp. 157 through 176.
*XC4000 Series Field Programmable Gate Arrays*, XILINX, Jul. 30, 1996, version 1.03, pp. 4–5 through 4–76.

*Primary Examiner*—Michael Tokar
*Assistant Examiner*—Daniel D. Chang
*Attorney, Agent, or Firm*—Townsend and Townsend and Crew LLP

[57] ABSTRACT

A hierarchical interconnect structure between logic elements, logic array blocks and global interconnects in a programmable logic device is disclosed. The present invention provides a first group of local interconnect lines that couple to outputs of more than one logic element in a block, and a second group of local interconnect lines that are divided into independent segments coupled to a subset of the logic elements in a block. By eliminating the one-to-one correspondence between the number of logic elements in a logic array block and the number of local interconnect wires, the present invention makes possible the inclusion of more logic element in one block in an area efficient manner.

20 Claims, 4 Drawing Sheets

HIERARCHICAL INTERCONNECT FOR PROGRAMMABLE LOGIC DEVICES

This application claims benefits of USC Provisional Ser. No. 60/027,874 filed Oct. 25, 1996.

BACKGROUND OF THE INVENTION

The present invention relates in general to integrated circuits, and in particular to an improved architecture for programmable logic devices (PLDs) that reduces the number of local interconnect wires necessary for logic blocks of greater granularity.

Programmable logic devices are digital, user-configurable integrated circuits used to implement custom logic functions. For the purposes of this description, the term PLD encompasses all digital logic circuits configured by the end-user, including programmable logic arrays (PLAs), field programmable gate arrays (FPGAs), erasable and complex PLDs and the like. The basic building block of a PLD is a logic element that is capable of performing limited logic functions on a number of input variables. A logic element is typically equipped with circuitry to programmably implement the "sum of products" logic, as well as one or more registers to implement sequential logic. Conventional PLDs combine together large numbers of such logic elements through an array of programmable interconnects to facilitate implementation of complex logic functions. Programmable logic devices have found particularly wide application as a result of their combined low up front cost and versatility to the user.

A variety of PLD architectural approaches arranging the interconnect array and logic elements have been developed to optimize logic density and signal routability between the various logic elements. Examples of successful PLD architectures are the FLEX® and MAX® family of programmable logic devices manufactured by Altera Corporation. In the FLEX® 8000 family of logic devices, for example, a large matrix of logic elements (LEs) is utilized. In one commercials embodiment of these devices, each LE includes a 4-input look-up table to implement combinational logic (e.g. AND,OR, NOT, XOR, NAND, NOR, and many others) and a register that provides sequential logic features. The LEs are arranged in groups of, for example, eight to form larger logic array blocks (LABs). A LAB includes, among other resources, an internal interconnect structure between its various LEs. Multiple LABs are arranged in a two dimensional array and are programmably connectable to each other and to the external pins of the device through global horizontal and vertical interconnect lines. In one embodiment, the programmability is achieved by programmable multiplexers that connect global and local interconnect lines to each LE. This architecture has met with substantial success and is considered pioneering in the area of programmable logic.

Continuous advances in semiconductor manufacturing technology have made possible integration of increasingly larger numbers of gates on a chip. Each new generation of PLDs is designed with appreciably higher logic density. Often the transition to the next generation requires new PLD architectures to fine tune and optimize the performance of the device. One design feature that is subject to reevaluation for new and higher density PLDs is the number of LEs per LAB. In complex programmable logic device (CPLD) architectures, there is a continuous effort to find the optimum number of LEs per LAB. On the one hand, a large number of LEs per LAB allows LAB overhead to be amortized over a greater number of LEs. On the other, each LE local output contributes to the widening of the multiplexer for each of the multiple LE inputs. The extra routing and multiplexing thus reduces efficiency up to a point where adding more LEs results in a less area efficient LAB. Larger LABs also result in longer local interconnect lines which place greater demands on the driver circuitry.

Improvements in PLD architectural design are therefore needed to provide the optimum balance between routing flexibility and logic density, and to address new design challenges posed by the more advanced process technologies.

SUMMARY OF THE INVENTION

The present invention provides a PLD that uses a hierarchical interconnect architecture between logic elements, logic array blocks and global interconnects. In one embodiment, the present invention provides a first group of local interconnect lines that couple to outputs of more than one LE in a LAB, and a second group of local interconnect lines that are divided into independent segments coupled to a subset of the LEs in a LAB. By eliminating the one-to-one correspondence between the number of LEs in a LAB and the number of local interconnect wires, the present invention increases the number of physical wire segments available for routing in a LAB, and makes possible the inclusion of more LEs in a LAB in an area efficient manner. This results in a smaller die area for a given number of LEs. Various driver circuitry are also provided to drive the signals on the novel hierarchical interconnect structure of the present invention.

Accordingly, in one embodiment, the present invention provides a programmable logic circuit that includes a plurality of logic elements arranged into a plurality of groups of logic array blocks, with each logic array block including a sub-set of the plurality of logic elements and a plurality of local interconnect lines. A global interconnect array programmably couples input/output terminals of the plurality of logic elements. The local interconnect lines are divided into a first type that couple to more than one logic element output in the logic array block, and a second type that couple to a single logic element output in the logic array block.

In one embodiment of the invention, the first type of local interconnect lines extend along a full length of the logic array block and couple to every logic element in the logic array block, and the second type of local interconnect lines include two groups of lines each extending along half length of the logic array block, respectively, and coupling to a respective half of the sub-set of the plurality of logic elements.

In another embodiment, the second type of local interconnect lines include four groups of lines extending along one quarter length of the logic array block, respectively, and coupling to a respective quarter of the sub-set of the plurality of logic elements.

A better understanding of the nature and advantages of the PLD of present invention with the hierarchical local interconnect will be had with reference to the detailed description and drawings below.

DESCRIPTION OF THE PREFERRED EMBODIMENT

Figure 1:
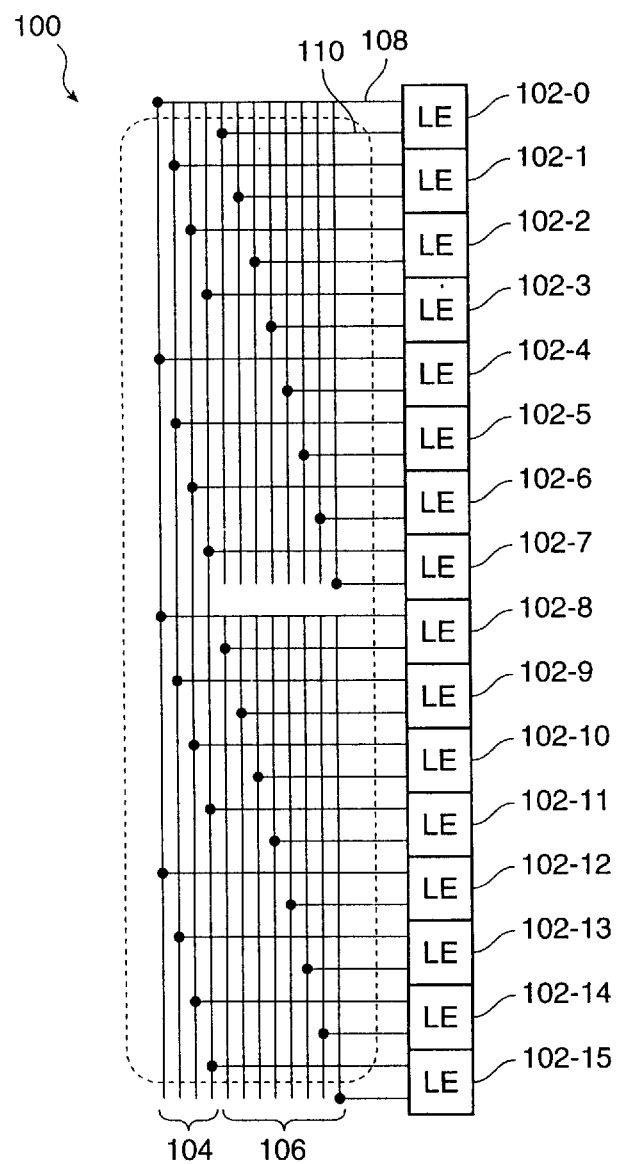
FIG. 1 shows a hierarchical interconnect structure according to one embodiment of the present invention for an exemplary PLD having 16 LEs per LAB.

Referring to FIG. 1, there is shown a simplified exemplary embodiment for a logic array block (LAB) 100 according to one embodiment of the present invention. A LAB as used in this description refers to a grouping of logic elements (LEs) in any type of PLD architecture that is made up of multiple LABs. The several LABs can be arranged in a two dimensional array and interconnected by a network of programmable interconnects. An example of one such PLD is described in detail in the commonly owned U.S. Pat. No. 5,436,575, entitled "Programmable Logic Array Integrated Circuits," which is hereby incorporated by reference in its entirety for all purposes.

LAB 100 is shown in FIG. 1 as having 16 logic elements (LEs) 102, and two different types of local interconnect lines. One type of local interconnect line, referred to herein as full-length (FL) local line 104, extends along the entire length of LAB 100 and connects to all 16 LEs 102. LAB 100 includes four FL local lines 104. The second type, referred to herein as half-length (HL) local line 106, is divided into two segments each extending along half the length of LAB 100. This embodiment includes two sets of eight HL local lines 108 that connect to a subset of LEs in LAB 100 as shown. It is to be understood that the number of LEs and local interconnect lines shown in FIG. 1 are for illustrative purposes only and are not restrictive.

FIG. 1 also shows the connection between the output of each LE 102 and local interconnect lines 104 and 106. One output line 108 of each of the 16 LEs 102 connects to one of the four FL local lines 104, such that each FL local line 104 is shared by four LE outputs. Output line 110 of each LE 102 connects to a HL local line 106. Because the length (and therefore the loading) of FL and HL lines are different, in this embodiment, LE output lines connecting to each local interconnect line require a correspondingly different drive capability. Thus, each LE is shown in FIG. 1 as having two output lines 108 and 110 that carry the same signal. Alternatively, depending on the resources inside each LE, one output line (108) may carry a combinatorial output signal while the other (110) carries a registered version of the output signal. Various embodiments for LE output driver circuitry will be described hereinafter in connections with FIGS. 4, 5, and 6.

Figure 2:
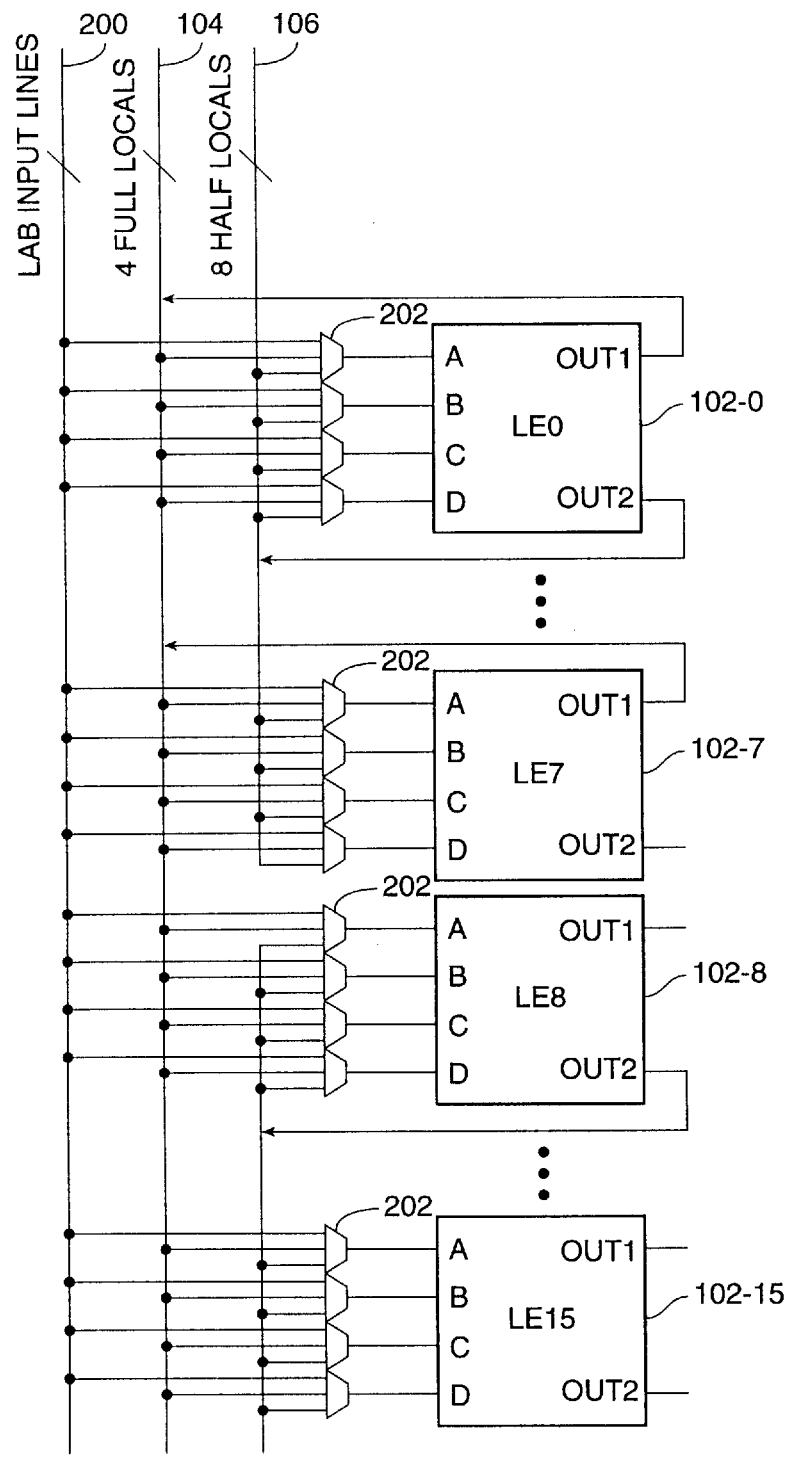
FIG. 2 shows a simplified input/output structure for exemplary logic elements in a LAB according to one embodiment of the present invention.

Each LE 102 may have, for example, four inputs. Using as an example, a PLD that employs multiplexers to program interconnections to logic elements such as the one described in the above-referenced U.S. Pat. No. 5,436,575, each input of an LE 102 receives an output of a dedicated multiplexer. This multiplexer receives all FL and HL local lines plus a predetermined number of additional LAB interconnect lines at a corresponding plurality of inputs. FIG. 2 shows a simplified diagram of an exemplary input/output interconnect structure for a LAB. In this example, each LE 102 has four inputs A, B, C, and D, and two outputs OUT1 and OUT2. There are four FL local lines 104, eight HL local lines 106, and a group of LAB lines 200. Output OUT1 of each LE connects to one of four FL local lines 104, and output OUT2 connects to one of eight HL local lines 106. Each input of LE 102 receives an output of a multiplexer (MUX) 202. Each MUX 202 receives all of FL and HL local lines 104 and 106, and LAB lines 200 at its inputs.

The exemplary LAB 100 in FIG. 2 includes 16 LEs 102, with four FL local lines 104 common to all 16 LEs resulting in four LE outputs sharing one FL local line. The total local interconnect channel width of this embodiment is, thus, 8+4=12 lines. The interconnect architecture of the present invention therefore results in a 25% reduction in the number of interconnect lines compared to the conventional approach where the output of every LE connects to a dedicated local interconnect line (i.e., for 16 LEs there would be 16 local interconnect lines).

The reduction in the number of local interconnect lines, made possible by the present invention, not only reduces the area used by the local interconnect channel, it also reduces the size of input multiplexers 202 (FIG. 2). That is, each MUX 202 receives four less inputs and is therefore narrower in size. Assuming the embodiment shown in FIG. 2 includes, for example, 20 LAB lines 200, each MUX 202 would be 20+4+8=32 input wide instead of 36 input wide. Given a large number of LABs and multiplexers in a CPLD, this can amount to a significant reduction in total die area. Therefore, a reduction of just four local lines, as is realized by the exemplary embodiment of the present invention shown in FIGS. 1 and 2, results in appreciable area savings. Reduced delays due to shorter HL lines as compared to FL lines is another advantage of the present invention.

Figure 3:
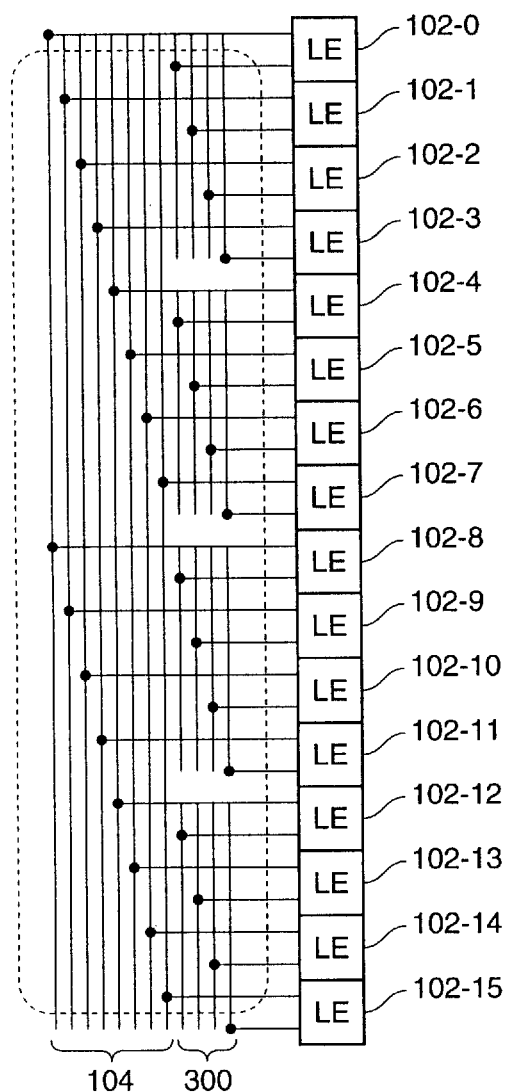
FIG. 3 shows a second embodiment for the PLD hierarchical interconnect structure of the present invention.

The connections through various levels of interconnects (e.g., global and local) in CPLDs are typically programmed by sophisticated software place-and-route tools. One of the factors that is considered in arriving at a number for FL and HL local lines as taught by the present invention, is the capability of the place-and-route software to cluster LEs. In the case of a very efficient layout, for example, an embodiment with four HL local lines for every group of four LEs may be preferred. In such an embodiment, a more accurate name for the HLs would be quarter-length (or QL) local lines. FIG. 3 shows such an alternate embodiment for a LAB in a PLD according to the present invention. This embodiment also includes 16 LEs 102, but instead of two sets of half length local interconnect lines, this embodiment includes four sets of quarter length (QL) local interconnect lines 300 each connected to a set of four LEs 102. Thus, each set of QL local lines 300 includes four wires. Additionally, there are eight FL local lines 104 connected to the 16 LEs 102 as shown. The local interconnect channel is just as wide (12 wires) as the previous embodiment. Similar principles of operation and advantages apply to this embodiment as that shown in FIGS. 1 and 2.

Those skilled in the art appreciate that there can be many variants on the hierarchical interconnect structure of the present invention. For example, a PLD may be designed with a LAB that has three levels of hierarchy in its internal interconnect lines. That is, a 16 LE LAB may have different groupings of LEs with connections to various numbers of QL, HL and FL local lines. The optimal arrangement for a given interconnect architecture will depend among other considerations on the type of process technology used (e.g., number of metal interconnect layers available) and the place-and-route software fitting constraints.

There may be a trade off in gaining the area advantages according to this invention in terms of routability internal to a LAB. Since not every LE in a LAB has a dedicated local interconnect line that can communicate with every other LE in that same LAB, routability within a LAB may be somewhat compromised. In the exemplary embodiment shown in FIGS. 1 and 2, for example, any one LE 100 can connect to any other, but a maximum of only four LEs can connect from one group of associated LEs to another. Similarly, in the exemplary embodiment of FIG. 3, while each LE can connect to any other LE within the LAB, a maximum of only eight LEs can connect from one group of associated LEs to another. Thus, flexibility in terms of internal communication within a LAB may be somewhat reduced. However, by using intelligent place and route software this trade off can become almost negligible. This is specially true given the drastic reduction in the probability of larger number of LEs driving other local LEs. In a LAB that includes, for example, eight LEs, the probability of more than four LE outputs driving other local LEs reduces drastically.

Furthermore, since logic within a LAB is permutable, an intelligent place and route software is capable of placing LEs that communicate with one another in the same group within a LAB. For example, two LEs that require communication with each other can be placed in the same group and use HL lines 106 (FIG. 1) or QL lines 300 (FIG. 3) to communicate with each other. Only if all the HL and QL lines are used, or when a destination LE is in a different group will it be necessary to use FL lines. It is therefore possible to maximize the use of shorter and therefore faster HL and QL lines and obtain the same level of fitting as when using only the physically longer (and therefore slower) FL lines. Thus, the benefits from the substantial area savings and speed enhancements offered by the interconnect structure of the present invention outweigh the almost negligible cost that may be incurred in terms of local routability.

Figure 4:
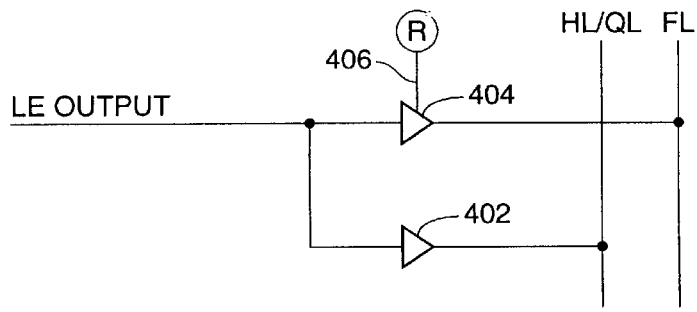
FIG. 4 shows a first embodiment for connecting LE outputs to local lines which uses two drivers.

As briefly discussed above, the interconnect structure according to the present invention requires different driver circuitry. For example, in the exemplary embodiments of the present invention described above, FL local lines 102 are shared among multiple LEs 102. These lines, therefore, are driven either by a separate driver with tristate capability or through two separate pass transistors. FIG. 4 shows one embodiment of a driver circuit 400 for an LE output. Driver circuit 400 includes a first driver element 402 whose output connects to a segmented local line (HL or QL), and a second driver element 404 whose output connects to a FL local line. Driver element 404 is tristatable and receives a tristate control input 406. This allows one LE to drive a FL local line while the other, for example, three that share the same FL local line to be tristated. Well known circuitry can be used to implement driver elements 402 and 404. The control signal for tristate input 406 can be supplied by a programmable element, such as a static random access memory (SRAM) cell. Other programmable elements such as fusible links, EEPROM cell, or the like, can also be used to supply the tristate signal.

Figure 5:
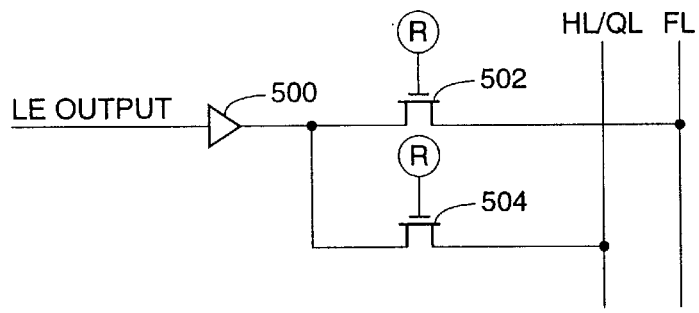
FIG. 5 shows a second embodiment for connecting LE outputs to local lines which uses one driver and two pass transistors.
Figure 6:
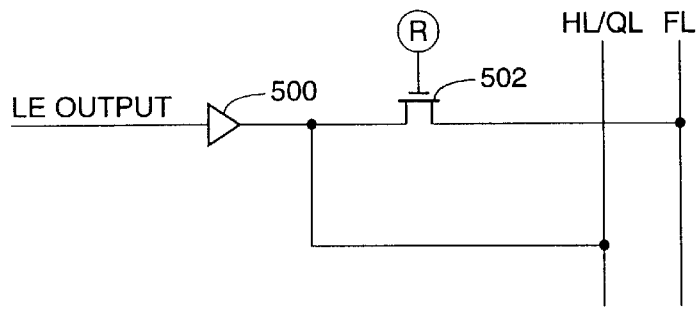
FIG. 6 shows yet another embodiment for connecting LE outputs to local lines which uses one driver and one pass transistor.

Another embodiment for a driver circuit for an LE output is shown in FIG. 5. This embodiment includes one driver element 500 that drives both FL and segmented (HL or QL) local lines through two separate pass transistors 502 and 504, respectively. The state of each pass transistor is controlled by a programmable element such as an SRAM cell. An alternative embodiment for the driver circuit of FIG. 5, is shown in FIG. 6. Since the segmented (HL or QL) local lines are not shared between LE outputs, it is possible to remove one of the pass transistors and drive each HL or QL directly as shown in FIG. 6. The additional resources needed to drive the local lines are minimal as compared to the area reduction made possible by the reduced interconnect channel width and input MUX sizes.

Figure 7:
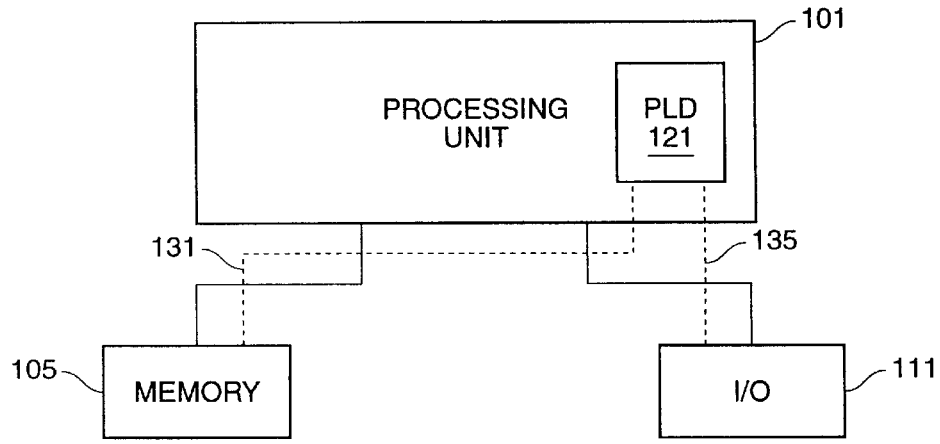
FIG. 7 is a block diagram of an electronic system within which a PLD according to the present invention may be advantageously employed.

FIG. 7 shows a block diagram of an electronic system within which a PLD according to the present invention may be advantageously employed. In the particular embodiment of FIG. 7, a processing unit 701 is coupled to a memory 705 and an I/O 711, and incorporates a PLD 721. PLD 721 may be specially coupled to memory 705 through connection 731 and to I/O 711 through connection 735. The system may be a digital computing system such as a general or special purpose computer, or a specialized digital switching network, or other processing system.

Among the various functions performed by processing unit 701, it may direct data to an appropriate system component for processing or storage, execute a program stored in memory 705, or interface with other systems using I/O 711. Processing unit 701 may be a central processing unit (CPU), microprocessor, floating point coprocessor, graphics coprocessor, hardware controller, microcontroller, programmable logic device programmed for use as a controller, or other processing unit. In some embodiments, processing unit 701 may be a separate and independent computing system. Processing unit 701 may be used to configure and program PLD 721.

In other embodiments, source code may be stored in memory 705, compiled into machine language, and executed by processing unit 701. Processing unit 701 need not contain a CPU and in one embodiment, instructions may be executed by one or more PLDs 721. Instead of storing source code in memory 705, only the machine language representation of the source code may be stored in memory 705 for execution by processing unit 701. Memory 705 may store configuration data for programming PLD 721. Alternatively, memory 705 may be a random access memory (RAM), read only memory (ROM), fixed or flexible disk media, PC Card flash disk memory, tape, or any other storage retrieval means, or any combination of these storage retrieval means.

Processing unit 701 uses I/O 711 to provide an input and output path for user interface. For example, a user may input logical functions to be programmed into programmable logic device 721. I/O 711 may be a keyboard, mouse, track ball, digitizing tablet, text or graphical display, touch screen, pen tablet, printer, or other input or output means, or any combination of these means.

PLD 721 may serve many different purposes within the system in FIG. 7. PLD 721 may be a logical building block of processing unit 701, supporting its internal and external operations. PLD 721 is programmed to implement the logical functions necessary to perform a particular function within the system operation.

In conclusion, the present invention provides various embodiments for a PLD with a hierarchical interconnect architecture between logic elements, logic array blocks and global interconnects. The hierarchical interconnect structure divides local interconnect lines inside a LAB into independent segments coupled to a sub-set of the LAB LEs. This eliminates the one-to-one correspondence between the number of LEs in a LAB and the number of local interconnect wires, and offers a more area efficient interconnect architecture. While the above is a complete description of several embodiments of the present invention, it is possible to use various alternatives, modifications and equivalents. Therefore, the scope of the present invention should be determined not with reference to the above description but should, instead, be determined with reference to the appended claims, along with their fall scope of equivalents.

What is claimed is:

1. A programmable logic circuit comprising:
    a plurality of logic array blocks, each logic array block comprising:
        a plurality of logic elements each having a plurality of inputs and an output, and
        a plurality of local interconnect lines selectively coupling to said plurality of inputs and output of each of said plurality of logic elements, said plurality of local interconnect lines having a first type that couple to more than one logic element output in said logic array block, and a second type that couple to a single logic element output in said logic array block; and
    a global interconnect array coupled to said plurality of logic array blocks and circuit input/output terminals.

2. The programmable logic circuit of claim 1 wherein said plurality of logic elements are divided into a first group and a second group, and wherein local interconnect lines of said second type are segmented into a first group respectively coupling to said first group of logic elements, and a second group respectively coupling to said second group of logic elements.

3. The programmable logic circuit of claim 2 wherein said first group of said second type of local interconnect lines extend substantially in parallel adjacent to said first group of logic elements, said second group of said second type of local interconnect lines extend substantially in parallel adjacent to said second group of logic elements, and said first type of interconnect lines extend substantially in parallel adjacent to all of said plurality of logic elements.

4. The programmable logic circuit of claim 2 wherein said first group and said second group of said plurality of logic elements each include half of said plurality of logic elements.

5. The programmable logic circuit of claim 1 wherein said plurality of logic elements are divided into four groups and said second type of local interconnect lines are divided into four groups respectively coupling to said four groups of said logic elements.

6. The programmable logic circuit of claim 2 wherein said logic array block comprises sixteen logic elements, said first type of local interconnect lines comprise four wires, and said first and second group of said second type of local interconnect lines each comprise eight wires.

7. The programmable logic circuit of claim 5 wherein said logic array block comprises sixteen logic elements, said first type of local interconnect lines comprise eight wires, and each of said four groups of said second type of local interconnect lines comprises four wires.

8. The programmable logic circuit of claim 6 wherein each one of said four wires of said first type of local interconnect lines is shared by outputs of four logic elements.

9. The programmable logic circuit of claim 1 wherein said output of each one of said plurality of logic elements couples to a local interconnect line through a respective driver circuit.

10. The programmable logic circuit of claim 9 wherein said driver circuit comprises a first driver element coupling said output of a logic element to a local interconnect line of said first type, and a second driver element coupling said output of said logic element to a local interconnect line of said second type.

11. The programmable logic circuit of claim 10 wherein said first driver element is programmably tristatable.

12. The programmable logic circuit of claim 9 wherein said driver circuit comprises a driver element that couples said output of a logic element to a local interconnect line of said first type through a first programmable pass transistor, and couples said output of said logic element to a local interconnect line of said second type through a second programmable pass transistor.

13. The programmable logic circuit of claim 9 wherein said driver circuit comprises a driver element that couples said output of a logic element to a local interconnect line of said first type through a programmable pass transistor, and couples said output of said logic element to a local interconnect line of said second type directly.

14. The programmable logic circuit of claim 1 further comprising a plurality of multiplexers each having a plurality of inputs coupled to said plurality of local interconnect lines, and an output respectively coupled to an input of said plurality of inputs of each of said plurality of logic elements.

15. A programmable logic device comprising:
    a plurality of logic array blocks, each logic array block comprising:
        a plurality of logic elements disposed adjacent to each other, each one having a plurality of inputs and an output,
        a first plurality of local interconnect lines extending substantially along a length defined by said plurality of logic elements, each one of said first plurality of local interconnect lines being coupled to a selected plurality of outputs of said plurality of logic elements, and
        a second plurality of local interconnect lines divided into a plurality of independent segments, each segment extending substantially along a length defined by a corresponding subset of said plurality of logic elements, each output of each one of said plurality of logic elements being coupled to a dedicated one of said second plurality of local interconnect lines; and
    a global interconnect array coupled to said plurality of logic array blocks and device input/output terminals.

16. The programmable logic device of claim 15 further comprising a plurality of multiplexers each having a plurality of inputs coupled to said first and second plurality of local interconnect lines, and an output respectively coupled to an input of said plurality of inputs of each of said plurality of logic elements.

17. In a programmable logic device having a plurality of logic array blocks (LABs) each including a row of logic elements, a method of arranging local interconnect lines in a LAB comprising the steps of:
    disposing a first plurality of local interconnect lines substantially in parallel to the row of logic elements, said first plurality of local interconnect lines having a length substantially equal to a length of the row of logic elements;
    coupling each of said first plurality of local interconnect lines to an output of more than one logic element;
    disposing a second plurality of local interconnect lines substantially in parallel to the row of logic element, said second plurality of local interconnect lines being divided into a plurality of independent segments; and
    coupling each of said second plurality of local interconnect lines to a an output of a single logic element.

18. The method of claim 17 wherein the LAB comprises 16 logic elements, said first plurality of interconnect lines comprise four wires each coupling to outputs of four logic elements, and said second plurality of interconnect lines comprise eight wires.

19. An electronic system comprising:

a processing unit including a programmable logic circuit as in claim 1;

a memory unit storing data;

an interface; and a bus network providing communication links between said processing unit, memory unit and interface.

20. The electronic system of claim 19 wherein said processing unit configures said programmable logic circuit.

* * * * *